United States Patent [19]

Suzuki et al.

[11] Patent Number: 4,573,039
[45] Date of Patent: Feb. 25, 1986

[54] DIGITAL TO ANALOG CONVERTER

[75] Inventors: Tadao Suzuki, Tokyo; Miki Abe, Yokohama, both of Japan

[73] Assignee: Sony Corporation, Tokyo, Japan

[21] Appl. No.: 432,845

[22] Filed: Oct. 5, 1982

[30] Foreign Application Priority Data

Oct. 8, 1981 [JP] Japan .................................. 56-160506

[51] Int. Cl.$^4$ ............................................ H03K 13/02
[52] U.S. Cl. ............................. 340/347 DA; 358/339
[58] Field of Search .... 340/347 DA, 347 C, 347 NT; 358/339

[56] References Cited

U.S. PATENT DOCUMENTS

| | | | |
|---|---|---|---|
| 3,469,253 | 9/1969 | Hunt | 340/347 DA |
| 3,576,575 | 4/1971 | Hellwarth et al. | 340/347 DA |
| 3,588,880 | 6/1971 | Gross et al. | 340/347 DA |
| 3,646,545 | 2/1972 | Naydan et al. | 340/347 DA |
| 3,877,028 | 4/1975 | Thomas | 340/347 DA |
| 3,976,991 | 8/1976 | Hickin et al. | 364/607 |
| 4,085,372 | 4/1978 | Mogi et al. | 340/347 DA |
| 4,138,694 | 2/1979 | Doi et al. | 358/339 |
| 4,258,355 | 3/1981 | Edwards | 340/347 DA |
| 4,404,546 | 9/1983 | Hata et al. | 340/347 DA |

Primary Examiner—Errol A. Krass
Assistant Examiner—Heather R. Herndon
Attorney, Agent, or Firm—Lewis H. Eslinger; Alvin Sinderbrand

[57] ABSTRACT

A digital to analog converter for converting alternately supplied first and second channel digital data words to first and second channel analog output signals comprises a current producing circuit for selectively producing currents corresponding to the digital data words, respectively; first and second channel voltage producing circuits for producing the first and second channel analog output signals in response to the currents from the current producing circuit; and a switch disposed between the current producing circuits and the first and second channel voltage producing circuits for selectively supplying the current corresponding to the first channel digital data word to the first channel voltage producing circuit and the current corresponding to the second channel digital data word to the second channel voltage producing circuit.

12 Claims, 12 Drawing Figures

DIGITAL TO ANALOG CONVERTER

BACKGROUND OF THE INVENTION

1. Field of the Invention

This invention relates to digial to analog converters, and more particularly, to counter-type digital to analog converters for use with digital stereophonic audio signals, such as pulse code modulation audio signals from disc or tape players or audio adapters.

2. Description of the Prior Art

In a digital stereophonic audio reproducing apparatus employing pulse code modulated signals, the digital signals must be converted to an analog signal for reproduction. A digital to analog converter used with a digital stereophonic audio reproducing apparatus must convert a pair of PCM audio signals, one signal for each of the left and right stereophonic channels. Counter-type digital to analog converters have heretofore been utilized because of their superior performance over other types of digital to analog converters.

A counter-type digital to analog converter includes a current producing circuit portion in which a digital counter is loaded with the data word to be converted to an analog signal. The digital counter counts clock pulses until the count contained therein reaches a value corresponding to the data word. A constant current source portion supplies a predetermined constant current during the period which begins when the counter begins counting the clock pulses and ends when the value in the counter reaches the predetermined count. An integrating circuit portion is also included in a counter-type digital to analog converter in which an integrator is supplied with the constant current from the current producing circuit portion. The integrator produces an integrated voltage from the constant current. A low pass filter filters the integrated voltage generated by the integrator to derive the analog output signal.

Prior art digital to analog converters have two current producing circuit portions and two integrating circuit portions, one pair for each of the left and right stereophonic channels. The time period for converting the digital data words to analog output signals is generally selected to be relatively long so that a low frequency clock pulse can be utilized. Accordingly, the time for deriving the analog output signal from the integrating circuit is relatively short.

Prior art digital to analog converters are thus complicated and expensive because of the duplication of circuitry in the left and right stereophonic channel circuits. The level of the analog output signal at high frequencies is also reduced since the time period for deriving the analog output signal from the integrating circuit is relatively short, while the time period for converting the digital data words to analog output signals is relatively long.

OBJECTS AND SUMMARY OF THE INVENTION

Accordingly, it is an object of the present invention to provide an improved counter-type digital to analog converter which avoids the above described disadvantages of the prior art.

It is another object of the present invention to provide an improved counter-type digital to analog converter which can convert two different kinds of data words supplied successively and alternately into two corresponding analog signals.

It is still a further object of the present invention to provide an improved counter-type digital to analog converter suitable for use with an apparatus supplying a digital stereophonic audio signal.

In accord with one aspect of the present invention, a digital to analog converter is provided for converting alternately supplied first and second channel digital data words to first and second channel analog output signals. The converter includes a current producing circuit for selectively producing the currents corresponding to the digital data words, respectively, first and second channel voltage producing circuits for producing the first and second channel analog output signals in response to the current from the current producing circuit, and a switch disposed between the current producing circuit and the first and second channel voltage producing circuits for selectively supplying the current corresponding to the first channel digital data word to the first channel voltage producing circuit and the current corresponding to the second channel digital data word to the second channel voltage producing circuit.

The above, and other objects, features and advantages of the invention will be apparent from the following detailed description of illustrative embodiments thereof, which is to be read in connection with the accompanying drawings.

DESCRIPTION OF THE PREFERRED EMBODIMENTS

Figure 1:
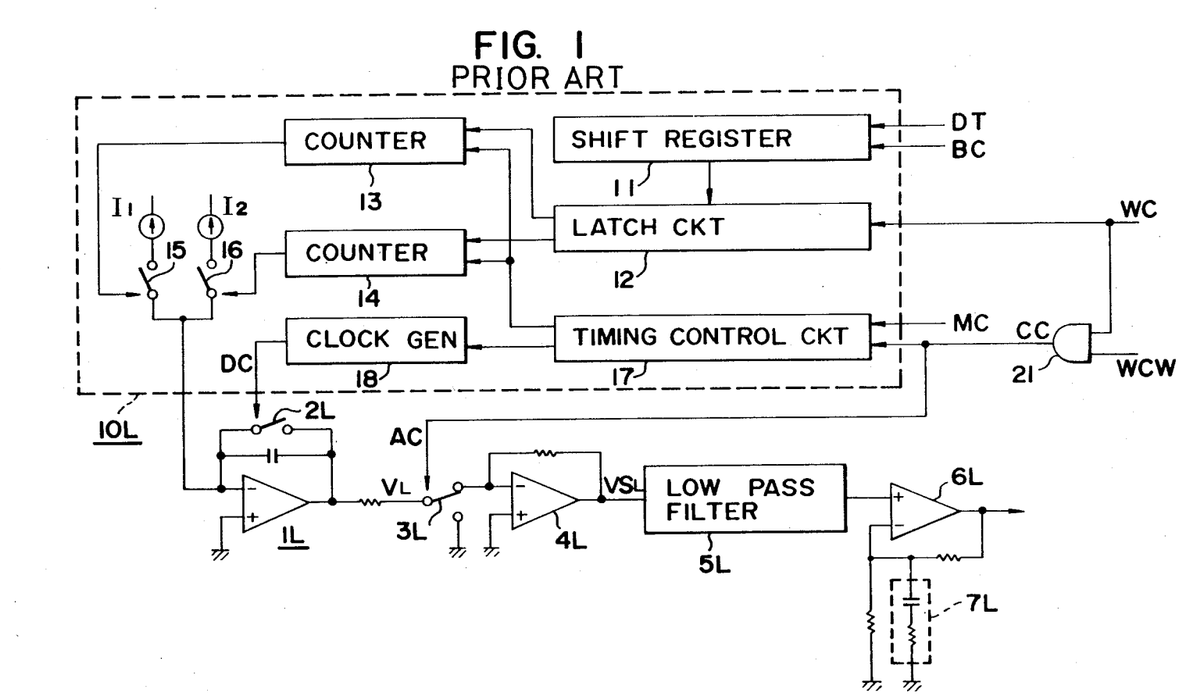
FIG. 1 is a circuit diagram illustrating a prior art counter-type digital to analog converter for converting a left channel data word into a left channel analog signal.
Figures 2, 3:
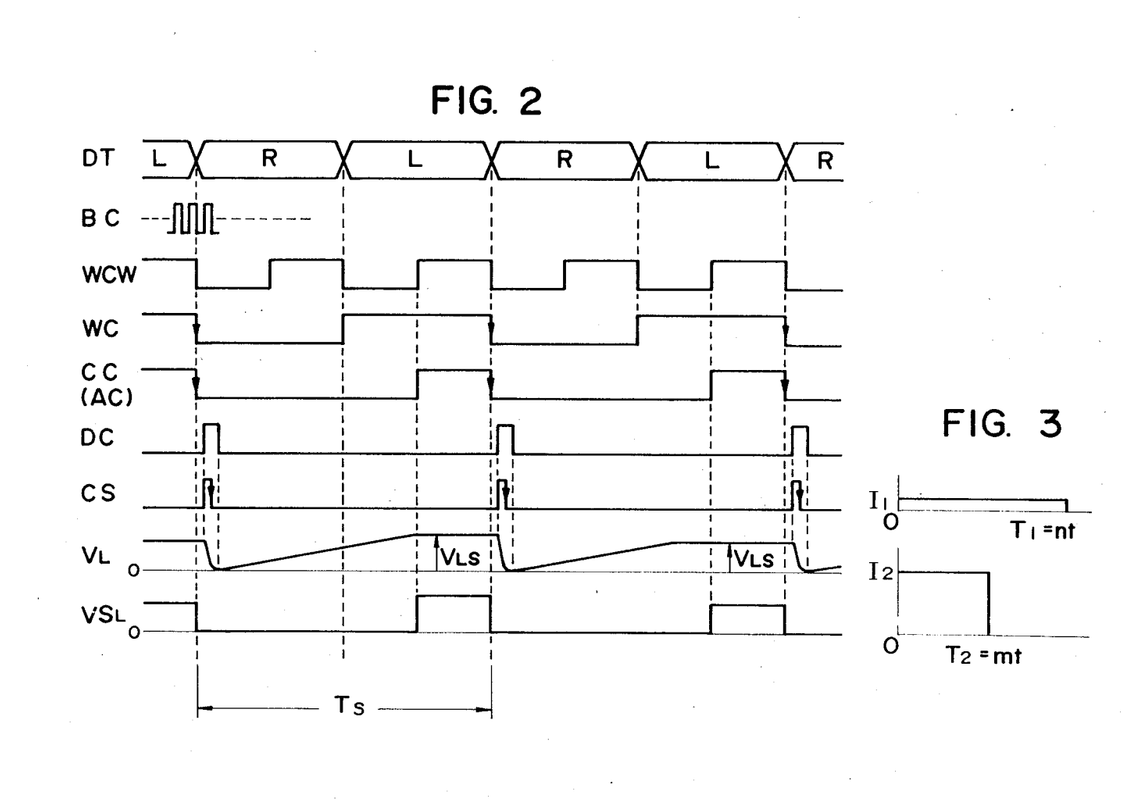
FIGS. 2 and 3 are waveform charts to which reference will be made in explaining the operation of the digital to analog converter of FIG. 1.

A prior art counter-type digital to analog converter is illustrated in FIG. 1 and may, for example, convert left channel data words, contained in a pulse code modulated stereophonic audio signal reproduced from magnetic tape, to corresponding left channel analog output signals. Left and right channel stereophonic data words comprising, in one example, sixteen bits, are alternately and successively supplied to the digital to analog converter as data words DT, as illustrated in FIG. 2. The bits comprising each digital word are serially supplied to the digital to analog converter. Left channel data words L and right channel data words R are successively and alternately supplied to a current producing circuit 10L which includes a digital counter for converting the left channel data words L to left channel analog output signals.

A decoder in the reproducing apparatus generates a bit clock signal BC of, for example, 1,4098 MHz, a clock signal WCW of, for example 88.112 MHz, and a word clock signal WC of, for example, 44.056 KHz.

Data words DT are supplied to the current producing circuit 10L and held in a sixteen bit shift register 11 in response to a rising edge of bit clock signal BC. Left channel data words L are then latched word by word into a sixteen bit latch circuit 12 in response to a falling edge of word clock signal WC.

In most prior art digital to analog converters, clock signal WCW has a frequency which is twice the frequency of word clock signal WC. Word clock signal WC and clock signal WCW are supplied to an AND gate 21 to generate a conversion command signal CC. Conversion command signal CC has a low level for the first, second and third quarters of a time period Ts between two contiguous falling edges of word clock signal WC, as illustrated in FIG. 2. Conversion command signal CC is supplied to a timing control 17 along with master clock pulses MC. The frequency of master clock pulses MC is higher than the frequency of bit clock signals BC, whereby timing signals such as a counter setting signal CS are generated from timing control circuit 17, as shown in FIG. 2. Master clock pulses MC are generated by timing control circuit 17 for the time period when conversion command signal CC is low. The timing signals from timing control circuit 17 are supplied to a discharge clock generator 18 which generates a discharge clock signal DC.

An integrator 1L is supplied with an output current from current producing circuit 10L to produce an integrated output voltage $V_L$ from the voltage supplied thereto. A switch 2L is connected between a minus input terminal and an output terminal of integrator 1L to reset integrator 1L in response to a discharge clock signal DC generated by clock generator 18 at a falling edge of conversion command signal CC. When integrated output voltage $V_L$ is reset to zero, the lower eight bits and upper eight bits of one left channel data word L latched in latch circuit 12 are respectively supplied to high speed eight bit counters 13 and 14. The output signals of counters 13 and 14 turn on a pair of switches 15 and 16, respectively, so that output currents $I_1$ and $I_2$ from current producing circuit 10L flow. In the prior art digital to analog converter of FIG. 1, currents $I_1$ and $I_2$ are selected to have the ratio of $1:2^8$ (i.e., 1:256).

Counters 13 and 14 count master clock pulses MC supplied from timing control circuit 17. When counter 13 reaches a count corresponding to the lower eight bit data word of the latched left channel data word, switch 15 is turned off to stop the flow of current $I_1$. When the contents of counter 14 reach a count corresponding to the data of the upper eight bits of the latched left channel data word, switch 16 is turned of to stop current $I_2$. As shown in FIG. 3, during the period in which conversion command signal CC is at a low level and master clock pulses MC are supplied to counters 13 and 14 from timing control circuit 17, current $I_1$ flows for time $T_1$ determined in response to the data of the lower eight bits, while current $I_2$ flows for time $T_2$ determined in response to the data of the upper eight bits. Assuming that the period of master clock pulses MC is t, the following relations exist:

$$T_1 = n \cdot t, \quad T_2 = m \cdot t,$$

where n and m are within the range of zero to $2^8 - 1$.

Currents $I_1$ and $I_2$ are supplied to integrator 1L and integrated output voltage $V_L$ is produced in response thereto. If integrated output voltage $V_L$, derived at the time when conversion command CC has its rising edge, is referred to as voltage $V_{LS}$, voltage $V_{LS}$ can be expressed as follows:

$$V_{LS} = \frac{1}{C}\left(\int_0^{T_1} I_1 \, dT + \int_0^{T_2} I_2 \, dT\right)$$

$$= \frac{1}{C}(I_1 \cdot T_1 + I_2 \cdot T_2)$$

$$= \frac{I_1}{C}(T_1 + 2^8 + T_2)$$

$$= \frac{I_1 \cdot t}{C}(n + 2^8 \cdot m)$$

$$= (n + 2^8 m) \cdot V_O$$

where C is the integrating capacitance of integrator 1L and $$V_O = \frac{I_1 \cdot t}{C}$$

Voltage $V_{LS}$ can thus assume one of $2^{16}$ stepped values varying by Vo from a minimum value of zero, when both n and m are zero, to a maximum value of $[2^8 - 1 + 2^8(2^8 - 1)] \cdot V_O = (2^{16} - 1) \cdot V_O$ when both n and m are $2^8 - 1$. Voltage $V_{LS}$ is held constant until switch 2L is turned on again by discharge clock signal DC at a time just after the next falling edge of conversion command signal CC. Conversion command signal CC is then supplied to a gate switch 3L as gating clock signal AC, so that voltage $V_{LS}$ is gated out through gate switch 3L during the final quarter of time period Ts, wherein the value of voltage $V_{LS}$ is held constant and gating clock signal AC is high.

Left channel data words L are converted into current and an integrated voltage is produced in response thereto during the first, second and third quarters of time period Ts of word clock signal WC, as illustrated in FIG. 3. Integrated voltage $V_{LS}$ is gated out by gate switch 3L during the final quarter of period Ts. Integrated voltage $V_{LS}$ from gate switch 3L is supplied to a buffer circuit 4L and a low pass filter 5L to be converted into an analog voltage. The analog voltage from low pass filter 5L is supplied to a line amplifier 6L to generate a left channel analog output signal.

The digital to analog converting circuit of FIG. 1 is provided for left channel data words L. A similar digital to analog converting circuit (not shown) is provided for converting right channel data words R. In the right channel digital to analog converting circuit, however, a word clock signal having a polarity opposite word clock signal WC is employed. A conversion command signal or gating clock signal and a discharge clock signal are also used and are shifted by one word period as compared with conversion command signal CC or gating clock signal AC. Accordingly, right channel data words R are converted into analog output signals shifted one time period away from the period during which left channel data words L are converted to analog output signals.

Figure 10:
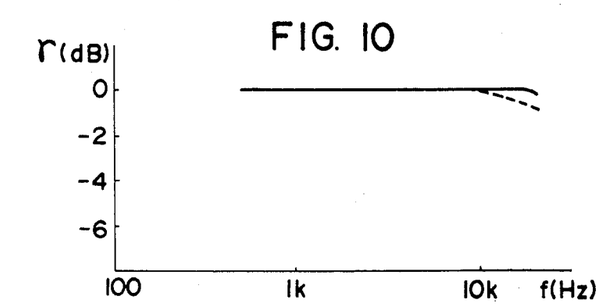
FIGS. 10, 11 and 12 are charts illustrating operating characteristics of the embodiments of FIGS. 4 and 6.

As is evident, prior art counter-type digital to analog converters have a pair of current producing circuit portions, making the circuit complicated and costly. The time for converting a data word into an integrated voltage is selected to be relatively long, such as one and a half word periods, and the time for gating the integrated voltage is selected to be relatively short, such as a half word period. Accordingly, the level of the analog output signal can not become large enough, especially in the high frequency range (as indicated in FIG. 10, and more fully explained hereinbelow). To correct for the decrease in the high frequency range, a peaking circuit 7L is connected to line amplifier 6L, as shown in FIG. 1, to derive a flat characteristic for the level of the analog output signal (illustrated in FIG. 10 as a solid line).

Figure 4:
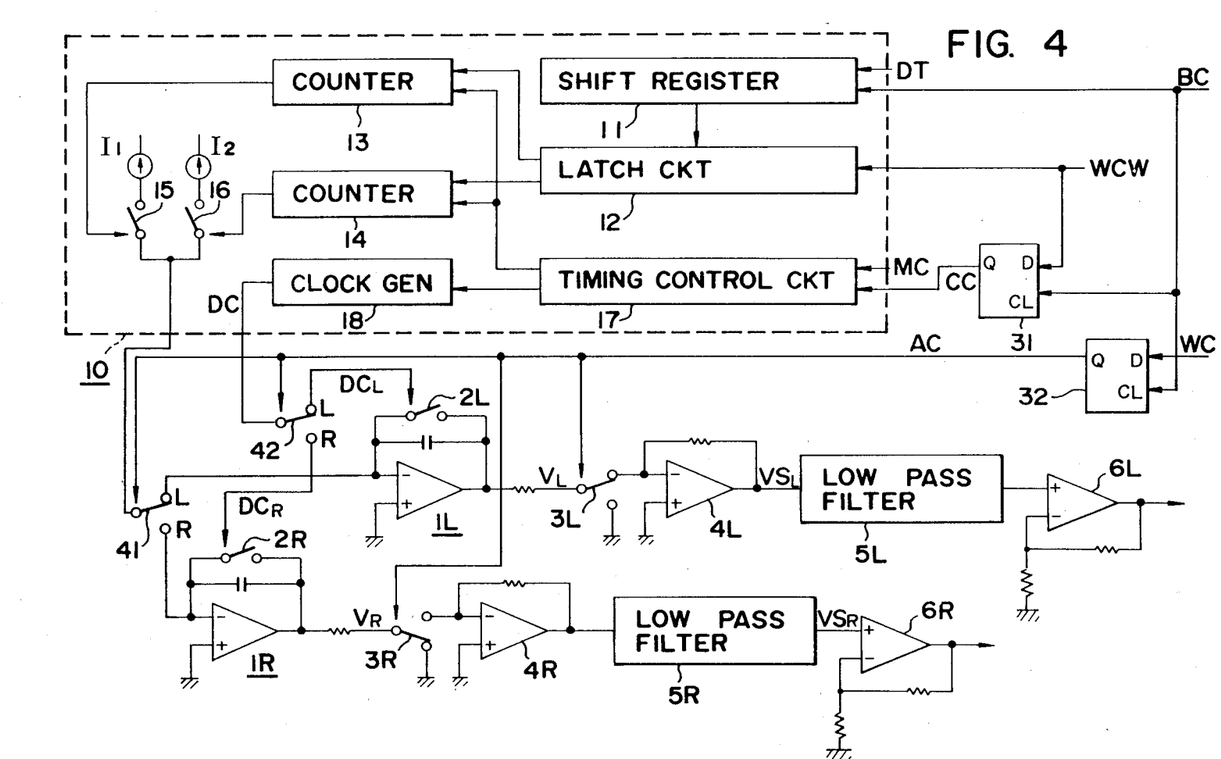
FIG. 4 is a circuit diagram illustrating one embodiment of a digital to analog converter in accord with the present invention.

FIG. 4 illustrates one embodiment of a counter-type digital to analog converter according to the present invention which can be used in a pulse code modulation audio system using a pulse code modulation stereophonic audio signal reproduced from magnetic tape. The illustrated embodiment includes a current producing circuit 10 which is substantially the same as current producing circuit 10L illustrated in FIG. 1. According to the present invention, however, current producing circuit 10 is used for both left and right channel data words, unlike the prior art digital to analog converter of FIG. 1, and is connected to left and right channel voltage producing circuits for generating the left and right channel analog output signals. The left channel circuit includes an integrator 1L, a switch 2L, a gate switch 3L, a buffer circuit 4L, a low pass filter 5L, and a line amplifier 6L, all operating as described in connection with FIG. 1. The right channel circuit includes an integrator 1R, a switch 2R, a gate switch 3R, a buffer circuit 4R, a low pass filter 5R, and a line amplifier 6R which correspond to elements in the left channel circuit. In addition, a switch 41 is providd for supplying the current from current producing circuit 10 alternately to integrators 1L and 1R. A further switch 42 is provided for supplying discharge clock signal DC derived from discharge clock generator 18 alternately to switch 2L and switch 2R. In FIG. 4, the left channel discharge clock signal is denoted by reference $DC_L$ and the right channel discharge clock signal is denoted as $DC_R$.

Figure 5:
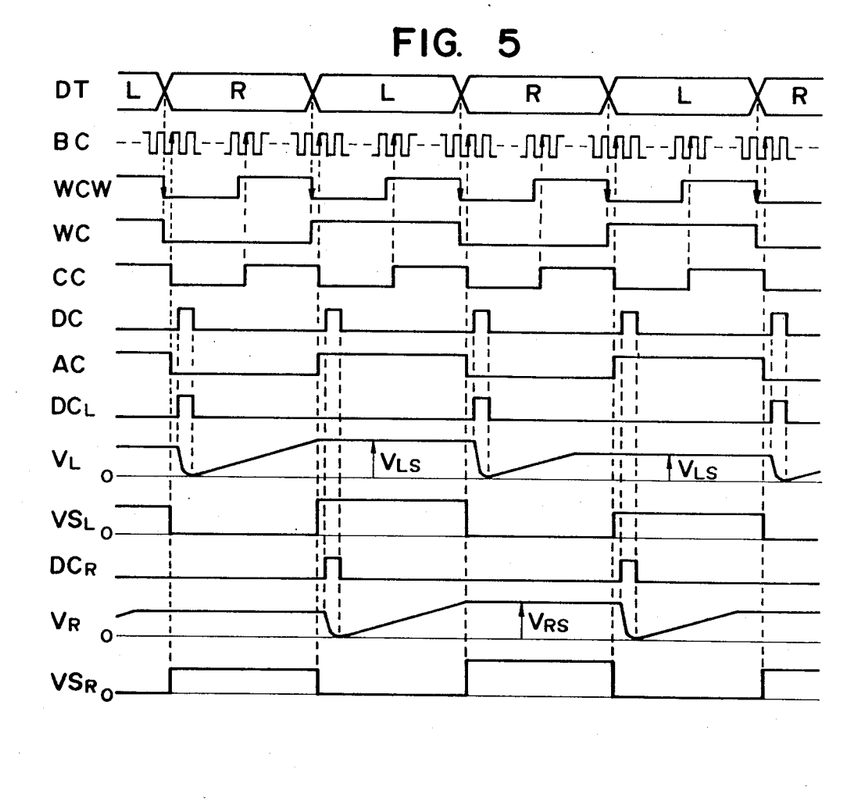
FIG. 5 shows waveform charts to which reference will be made in explaining the operation of the embodiment of the digital to analog converter of FIG. 4.

Serial data DT are supplied to current producing circuit 10 and held in shift register 11 in response to a rising edge of bit clock signal BC. Left and right channel data words L and R are latched word by word into latch circuit 12 in response to a falling edge of clock signal WCW. In the illustrated embodiment, the frequency of clock signal WCW is selected to be twice the frequency of word clock signal WC, as shown in FIG. 5.

Master clock pulses MC supplied to timing control circuit 17 have a frequency which is one and a half times the frequency of the master clock pulses used for the prior art digital to analog converter illustrated in FIG. 1. Accordingly, each of the data words is converted into current during one word period which is approximately two thirds the conversion period of prior art digital to analog converters.

Conversion command signal CC supplied to timing control circuit 17 has a frequency which is twice the frequency of word clock signal WC. Gating clock signal AC is generated separately from conversion command signal CC and changes for each word period in accord with word clock signal WC. Gating clock signal AC is also supplied to switches 41 and 42 and gate switches 3L and 3R.

Consequently, clock signal WCW is utilized as conversion command signal CC, while word clock signal WC is utilized as gating clock signal AC. As explained hereinbefore, both word clock signal WC and clock signal WCW are derived from the decoder in the reproducing apparatus and frequently contain jitters (small, rapid variations caused by fluctuations in supply voltages or the like). Output voltages $VS_L$ and $VS_R$ derived from buffer circuits 4L and 4R and gate switches 3L and 3R, respectively, have undesirable variations in pulse width and are not always precisely aligned in time because of the jitters, so that the digital to analog conversion is not always accurately performed. Conversion command signal CC and gating clock signal AC are thus synchronized with the rising edge of bit clock signal BC in accord with the present invention to avoid the undersirable effects caused by the jitters.

A pair of D-type flip-flop circuits 31, 32 are provided to generate conversion command signal CC and gating clock signal AC in synchronism with bit clock signal BC. When clock signal WCW and bit clock signal BC are supplied to a data input terminal D and a clock input terminal CL of D-type flip-flop circuit 31, respectively, conversion command signal CC is supplied at an output terminal Q and has its falling edge corresponding to a rising edge of bit clock signal BC appearing just after a falling edge of clock signal WCW, and a rising edge corresponding to a rising edge of bit clock signal BC appearing just after a rising edge of clock signal WCW, as illustrated in FIG. 5. When word clock signal WCW and bit clock signal BC are supplied to a data input terminal D and a clock input terminal CL of D-type flip-flop circuit 32, respectively, gating clock signal AC is generated at an output terminal Q thereof and has its falling edge corresponding to a rising edge of bit clock signal BC appearing just after a falling edge of word clock signal WC and a rising edge in response to a rising edge of bit clock signal BC appearing just after a rising edge of word clock signal WC, also as illustrated in FIG. 5.

The timing signals, such as the counter setting signal derived from timing control circuit 17, have a period length of one word. Master clock pulses MC are always supplied to both counters 13 and 14 from timing control circuit 17. Discharge clock signal DC generated by discharge clock generator 18 also has a period length of one word.

With reference to the conversion of left channel data words L, switch 2L is turned on by left channel discharge clock signal $DC_L$ just after a falling edge of gating clock signal AC so that output voltage $V_L$ of integrator 1L is reset to zero. The lower eight bits and the upper eight bits of one left channel data word L previously latched into latch circuit 12 are supplied to counters 13 and 14, respectively, in response to the resetting of output voltage $V_L$ to zero. Output currents $I_1$ and $I_2$ from current producing circuit 10 then flow. Current $I_1$ flows for a time determined in accord with the data of the lower eight bits, while current $I_2$ flows for a time in accord with the data of the upper eight bits. Currents $I_1$ and $I_2$ flow for a one word period when gating clock signal AC is at a low level. Currents $I_1$ and $I_2$ are supplied to integrator 1L and an integrated voltage $V_L$ is supplied at its output terminal. Integrated voltage $V_L$ becomes voltage $V_{LS}$ at the beginning of the next one word period during which gating clock signal AC is high. Voltage $V_{LS}$ is held constant during the next one word period and is gated out by gate switch 3L. The voltage gated by gate switch 3L is supplied to buffer circuit 4L, and voltage $VS_L$ of buffer circuit 4L is supplied to low pass filter 5L to be converted into an analog level.

Right channel data words R are converted into analog signals in very much the same manner as hereinbefore described with reference to left channel data words L. However, each right channel data word R is converted into an analog signal shifted one period away from the corresponding period for the conversion of left channel data word L.

Figure 6:
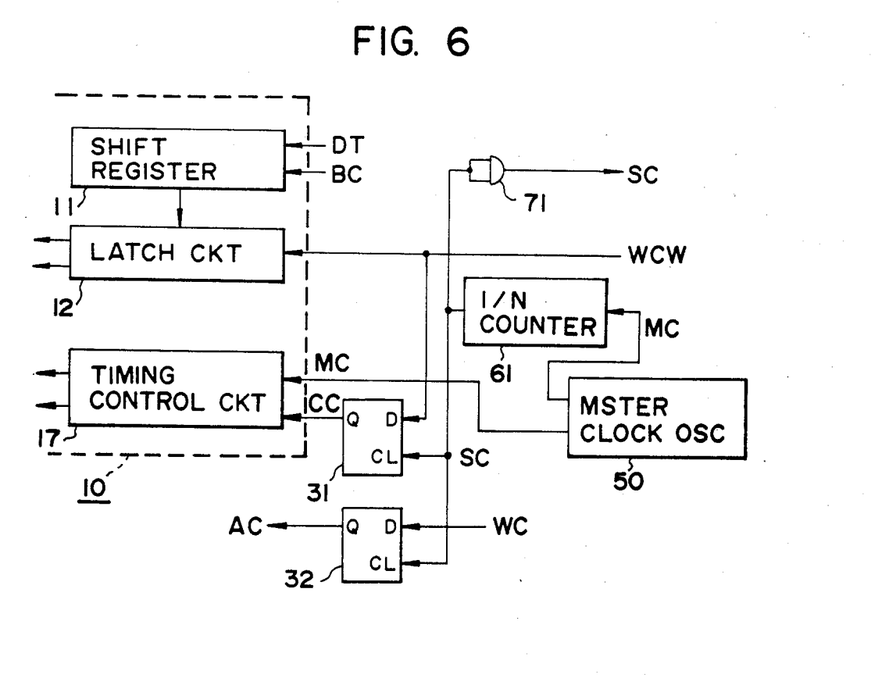
FIG. 6 is a circuit diagram illustrating a portion of an alternate embodiment of a digital to analog to digital converter in accord with the present invention.

FIG. 6 illustrates another embodiment of a counter-type digital to analog converter in accord with the present invention which is particularly suited for use with a digital audio disc system having a pulse code modulation stereophonic audio signal. A digital audio disc system operates, in one example, with a system clock signal having a frequency of 8.6436 MHz. In the illustrated embodiment, master clock pulses MC for operating the digital to analog converter have a frequency which is N times as high as the frequency of the system clock signal, where N is a positive integer. The operation of the digital to analog converter is thus synchronized with the operation of the digital audio disc system.

In the embodiment of FIG. 6, master clock pulses MC generated by a master clock oscillator 50 are supplied to current producing circuit 10 and a 1/N counter 61. A system clock signal SC of, for example, 8.6436 MHz is generated by 1/N counter 61. System clock signal SC is supplied to clock input terminals CL of D-type flip-flop circuits 31 and 32 to generate gating clock signal AC and conversion command signal CC and thereby avoid the undersirable effects of the jitters. System clock signal SC is also supplied to the digital audio disc system through a buffer circuit 71.

Figure 7:
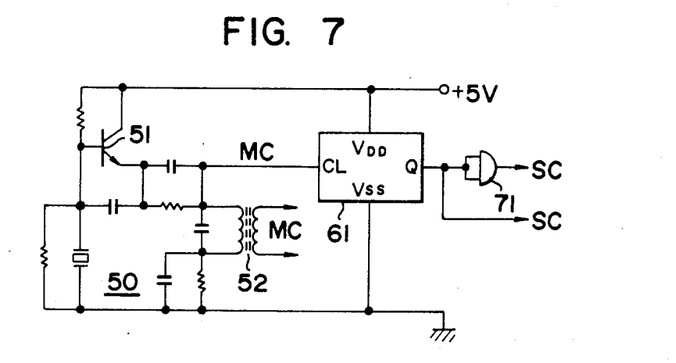
FIG. 7 is a detailed circuit diagram illustrating a master clock oscillator for use with the embodiment of FIG. 6.

In FIG. 7, master clock oscillator 50 comprises a transistor 51 with its emitter connected to an oscillating transformer 52. Master clock signal MC generated by the primary winding of transformer 52 is supplied to the CL input terminal of 1/N counter 61. Master clock signal MC generated by the secondary winding of transformer 52, which is shown in FIG. 7 in a floating state, is supplied to the digital to analog converter.

Generally, a counter-type digital to analog converter produces an analog output signal at a level which is either higher or lower than a predetermined reference voltage level. Accordingly, the DC level of the analog output signal must be adjusted, resulting in problems of level drift caused by variations in temperature. Generally, a digital to analog converter in an audio system does not need to transmit the DC level of its analog output signal.

Figures 8, 9:
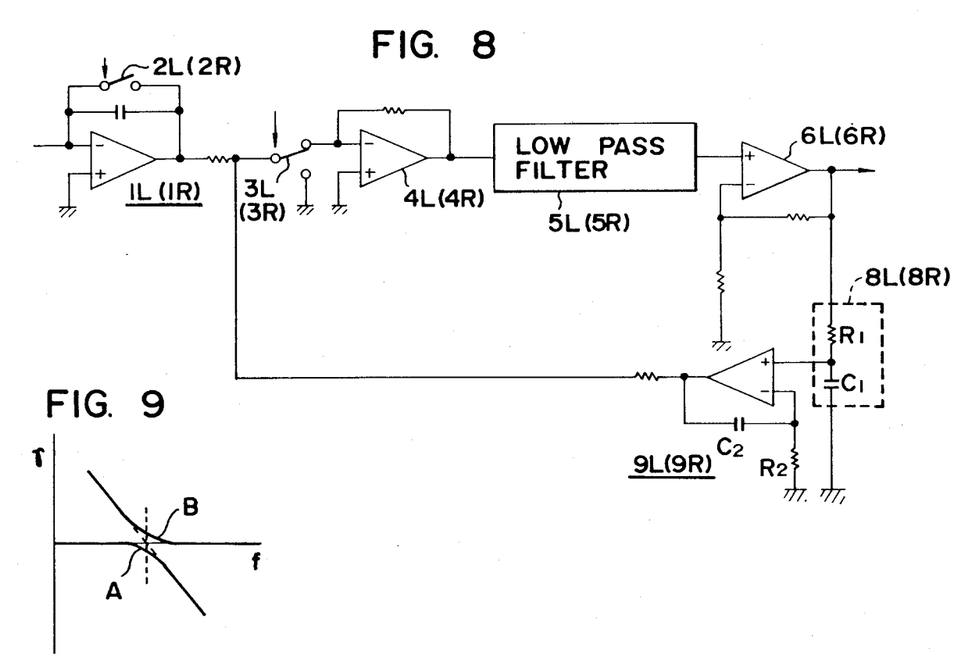
FIG. 8 is circuit diagram illustrating a portion of a circuit useful for effecting an automatic DC-offset to an analog output signal from a digital to analog converter in accord with the present invention.
FIG. 9 is a chart illustrating the operating characteristics of the circuit of FIG. 8.

FIG. 8 illustrates a circuit applicable to a digital to analog converter in accord with the present invention for making a DC-offset to the analog output signal adjustment free. The analog output signals derived from line amplifiers 6L and 6R, respectively, are supplied to additional low pass filters 8L and 8R each having resistance $R_1$ and capacitance $C_1$. The DC output signals from low pass filters 8L and 8R are fed back to the input terminals of gate switches 3L and 3R through additional integrator 9L and 9R, each having resistance $R_2$ and capacitance $C_2$. Accordingly, DC offset voltages at the output terminals of line amplifiers 6L and 6R are reduced. In a preferred embodiment, when a time constant $C_1 \cdot R_1$ is selected to be equal to a time constant $C_2 \cdot R_2$, each of low pass filters 8L and 8R has a frequency response illustrated as curve A in FIG. 9, where the ordinate represents the response level r and the abscissa represents the frequency f. Integrators 9L and 9R have a frequency response illustrated as curve B in FIG. 9, whereby a stabilized DC feedback loop is employed.

In a counter-type digital to analog converter in accord with the present invention, current producing circuit 10 supplies current for both the left and right channel data words for the conversion into respective left and right channel currents in a time-sharing manner. Therefore, the circuitry of a digital to analog converter in accord with the present invention is simplified and the cost is reduced in comparison with prior art digital to analog converters which have a pair of separate current producing circuits for converting the left and right data words into respective currents. Since the time period during which the output voltage of each of integrators 1L and 1R is increased to one word, the level of each of the left and right channel analog output signals is increased, for example, by 6 dB, with a correspondingly flat frequency response, as indicated by the solid curve in FIG. 10, where the ordinate represents the response level r and the abscissa represents the frequency f. Further, a digital to analog converter in accord with the present invention does not use peaking circuits to obtain the flat frequency response illustrated in FIG. 10, unlike prior art digital to analog converters. Word clock signal WC and clock signal WCW derived from the decoder in the reproducing apparatus are synchronously latched with bit clock signal BC or system clock signal SC to be used as gating clock signal AC and conversion command signal CC, respectively. Voltages $VS_L$ and $VS_R$ generated by buffer circuits 4L and 4R are not affected by undesirable jitters contained in word clock signal WC and clock signal WCW, so that the data words are accurately converted into analog output signals.

Figure 11:
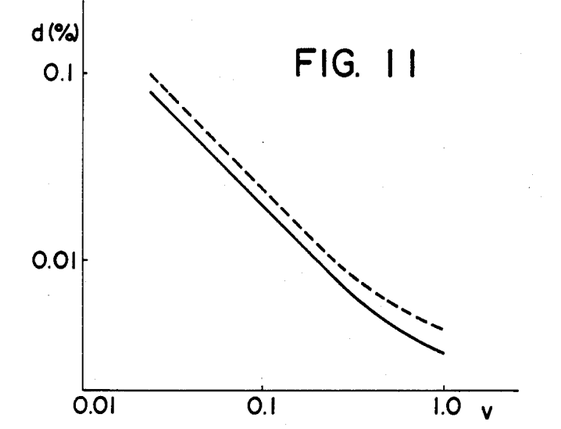
Figure 12:
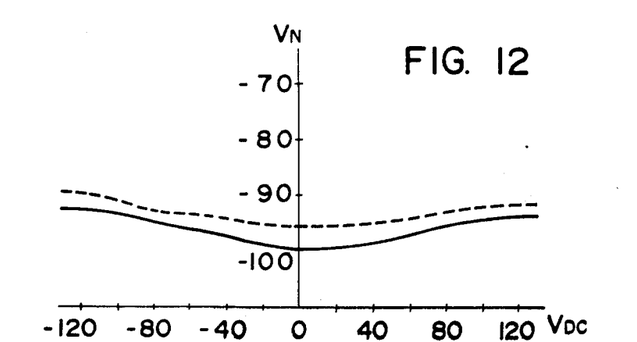

As illustrated by the solid lines of FIGS. 11 and 12, analog output signal distortion caused by undesirable harmonics and residual noise is also reduced, with both word clock signal WC and clock signal WCW latched as hereinbefore described. As illustrated by the dotted lines in FIGS. 11 and 12 and discussed hereinbefore, distortion caused by undesirable harmonics and residual noise is increased in prior art digital to analog converters in which word clock signal WC and clock signal WCW are used as gating clock signal AC and conversion command signal CC and are not latched in synchronism with bit clock signal BC or system clock signal SC.

Although specific embodiments of the present invention have been described in detail herein with reference to the accompanying drawings, it is to be understood that the invention is not limited to those precise embodiments, and that various changes and modifications may be effected therein by one skilled in the art without departing from the spirit and scope of the invention as defined in the appended claims.

What is claimed is:

1. A digital to analog converter for converting alternately supplied first and second channel digital data words to first and second channel analog output signals, comprising:
    current producing means common to said first and second channel digital data words for alternately producing currents having variable magnitudes and durations corresponding to said first and second channel digital data words, respectively;
    first and second channel voltage producing means for respectively producing said first and second channel analog output signals in response to said magnitudes and said durations of said currents corresponding to said first and second channel digital data words; and
    switch means disposed between said current producing means and said first and second channel voltage producing means for selectively supplying each said current corresponding to one of said first channel digital data words to said first channel voltage producing means and each said current corresponding to one of said second channel digital data words to said second channel voltage producing means.

2. The digital to analog converter of claim 1; wherein said current producing means comprises:
    latch means for successively latching said first and second channel digital data words;
    counter means for generating a value corresponding to said digital data word latched in said latch means; and
    current supplying means coupled to said counter means for producing a current having a magnitude and a duration corresponding to said value generated by said counter means.

3. The digital to analog converter of claim 2; wherein each of said first and second channel voltage producing means comprises:
    integrating means for producing an integrated voltage in response to said current produced by said current producing means;
    reset switch means coupled to said integrating means for resetting said integrated voltage to a predetermined level;
    gate switch means for gating said integrated voltage from said integrating means; and
    low pass filter means coupled to said gate switch means for producing a filtered integrated voltage.

4. The digital to analog converter of claim 3; and further comprising first flip-flop means for generating clock pulses to actuate said current producing means.

5. The digital to analog converter of claim 4; and further comprising second flip-flop means for generating clock pulses to actuate said switch means and said gate switch means.

6. The digital to analog converter of claim 3; and further comprising line amplifier means coupled to said low pass filter means for amplifying said filtered integrated voltage.

7. The digital to analog converter of claim 6; and further comprising buffer means connected between said gate switch means and said low pass filter means.

8. A digital to analog converter for converting alternately supplied first and second channel digital data words to first and second channel analog output signals, comprising:
    current producing means common to said first and second channel digital data words for alternately producing currents of changing magnitudes and durations corresponding to said first and second channel digital data words, respectively;
    first and second channel voltage producing means for producing said first and second channel analog output signals, respectively in response to the magnitudes and durations of said currents corresponding to said first and second channel digital data words, each of said first and second channel voltage producing means including integrating means for producing an integrated voltage in response to said current produced by said current producing means, reset switch means coupled to said integrating means for resetting said integrated voltage to a predetermined level, gate switch means for gating said integrated voltage from said integrating means, first low pass filter means coupled to said gate switch means for producing a filtered integrated voltage, line amplifier means coupled to said first low pass filter means for amplifying said filtered integrated voltage, second low pass filter means coupled to said line amplifier means, and second integrator means coupled to said second low pass filter means for supplying a D.C. feedback signal to said gate switch means; and
    switch means disposed between said current producing means and said first and second channel voltage producing means for selectively supplying each said current corresponding to one of said first channel digital data words to said first channel voltage producing means and each said current corresponding to one of said second channel digital data words to said second channel voltage producing means.

9. The digital to analog converter of claim 8; wherein said second low pass filter means comprises resistor means having a resistance value $R_1$ and capacitor means having a capacitance value $C_1$, and said second integrator means has a resistance value $R_2$ and a capacitance value $C_2$, and wherein a time constant $C_1 \cdot R_1$ of said second low pass filter means is approximately equal to a time constant $C_2 \cdot R_2$ of said second integrator means.

10. The digital to analog converter of claim 3; and further comprising system clock means for providing system clock pulses at a first predetermined frequency to said current producing means.

11. The digital to analog converter of claim 10; wherein said system clock means includes master clock oscillator means for providing master clock pulses at a second predetermined frequency, and counter means coupled to said master clock oscillator means for producing said system clock pulses.

12. The digital to analog converter of claim 11; wherein said first predetermined frequency is an integral number of times higher than said second predetermined frequency.

* * * * *